US008771919B2

(12) United States Patent
Wu et al.

(10) Patent No.: US 8,771,919 B2
(45) Date of Patent: Jul. 8, 2014

(54) LASER MARKING PROCESS AND ARTICLES

(75) Inventors: Pingfan Wu, Woodbury, MN (US); Junkang Jacob Lui, Woodbury, MN (US); Robert L. W. Smithson, Mahtomedi, MN (US); Rachel M. Lucking, Oakdale, MN (US); Panu K. Zoller, River Falls, WI (US); Jeffrey O. Emslander, Stillwater, MN (US); Kanta Kumar, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 88 days.

(21) Appl. No.: 13/390,407

(22) PCT Filed: Aug. 31, 2010

(86) PCT No.: PCT/US2010/047321
§ 371 (c)(1),
(2), (4) Date: Feb. 14, 2012

(87) PCT Pub. No.: WO2011/026106
PCT Pub. Date: Mar. 3, 2011

(65) Prior Publication Data

US 2012/0141752 A1 Jun. 7, 2012

Related U.S. Application Data

(60) Provisional application No. 61/238,371, filed on Aug. 31, 2009.

(51) Int. Cl.

| | |
|---|---|
| ***G03F 7/00*** | (2006.01) |
| ***G03F 7/11*** | (2006.01) |
| ***G03F 7/105*** | (2006.01) |
| ***B32B 3/00*** | (2006.01) |
| ***B32B 27/08*** | (2006.01) |

(52) U.S. Cl.
USPC .................... 430/270.1; 430/273.1; 430/945; 428/203; 428/515

(58) Field of Classification Search
USPC ........ 430/270.1, 7, 945, 273.1, 907; 428/515, 428/203
See application file for complete search history.

(56) References Cited

U.S. PATENT DOCUMENTS

RE24,906 E 12/1960 Ulrich
4,181,752 A 1/1980 Martens et al.
(Continued)

FOREIGN PATENT DOCUMENTS

DE 19652 253 6/1998
DE 10 2007 034636 11/2007
(Continued)

OTHER PUBLICATIONS

Machine translation of JP 2009-279905 (no date).*
(Continued)

*Primary Examiner* — Amanda C. Walke
(74) *Attorney, Agent, or Firm* — James A. Baker

(57) ABSTRACT

A process to mark a multilayered article with a laser (20). The multilayered article (10) includes a laser-markable layer (14) having at least one organic polymer and at least one light-sensitive pigment therein, and including at least one release agent associated with the laser-markable layer. Laser-marking of the laser-markable layer is accomplished by directing laser radiation (22) into the multilayered article through the release agent (12) to induce an interaction between the light-sensitive pigment and the organic polymer. As a result of the interaction, a visually perceptible marking (16) is formed in the article. The laser-marked article includes a laser-markable layer and a first release agent associated with a surface of the laser-markable layer. The marking(s) in the laser-markable layer is visible through the layer of release agent, and the marking is a result of the laser-induced interaction between the light-sensitive pigment and the organic polymer.

19 Claims, 3 Drawing Sheets

(56) References Cited

U.S. PATENT DOCUMENTS

| | | | | |
|---|---|---|---|---|
| 4,472,480 | A | 9/1984 | Olson | |
| 4,818,610 | A | 4/1989 | Zimmerman et al. | |
| 4,822,973 | A | 4/1989 | Fahner et al. | |
| 4,830,910 | A | 5/1989 | Larson | |
| 4,855,992 | A | 8/1989 | Ikegawa et al. | |
| 4,968,766 | A | 11/1990 | Kendziorski | |
| 5,206,075 | A | 4/1993 | Hodgson, Jr. | |
| 5,242,650 | A * | 9/1993 | Rackovan et al. | 264/509 |
| 5,340,628 | A | 8/1994 | McKillip | |
| 5,770,283 | A | 6/1998 | Gosselin et al. | |
| 5,831,661 | A | 11/1998 | Tabuchi et al. | |
| 5,843,547 | A | 12/1998 | Kulper et al. | |
| 5,858,150 | A | 1/1999 | Yarusso et al. | |
| 6,110,552 | A * | 8/2000 | Casey et al. | 428/40.1 |
| 6,403,190 | B1 * | 6/2002 | Casey et al. | 428/41.8 |
| 6,660,354 | B2 | 12/2003 | Suwa et al. | |
| 6,824,849 | B2 | 11/2004 | Herzog et al. | |
| 6,982,107 | B1 | 1/2006 | Hennen | |
| 7,033,677 | B2 * | 4/2006 | Busch et al. | 428/515 |
| 7,345,123 | B2 | 3/2008 | Qiu et al. | |
| 2003/0017308 | A1 | 1/2003 | Chen | |
| 2004/0022967 | A1 | 2/2004 | Lutz et al. | |
| 2004/0071994 | A1 | 4/2004 | Busch et al. | |
| 2006/0029760 | A1 | 2/2006 | Kreft et al. | |
| 2007/0098900 | A1 | 5/2007 | Abe et al. | |
| 2008/0076065 | A1 | 3/2008 | Bennett et al. | |
| 2011/0076452 | A1 | 3/2011 | Sakagami et al. | |
| 2012/0164419 | A1 | 6/2012 | Sakagami et al. | |

FOREIGN PATENT DOCUMENTS

| | | |
|---|---|---|
| EP | 1 146 392 | 10/2001 |
| EP | 1 628 279 | 2/2006 |
| EP | 1 852 269 | 11/2007 |
| EP | 1 905 585 | 4/2008 |
| JP | 2009279905 A * | 12/2009 |
| WO | WO 95/34263 | 12/1995 |
| WO | WO 00/61364 | 10/2000 |
| WO | WO 02/36357 | 5/2002 |
| WO | WO 02/068192 | 9/2002 |
| WO | WO 2007/114829 | 10/2007 |
| WO | WO 2009/145059 | 12/2009 |
| WO | WO 2010/095747 | 8/2010 |
| WO | WO 2011/026106 | 3/2011 |

OTHER PUBLICATIONS

LeMercier et al., "Near-surface defects created by 355 nm laser irradiation of rutile", *J. of Appl. Phys.*, 76 (6), Sep. 15, 1994, pp. 3341-3346.

Sol et al., "Ultraviolet laser irradiation induced chemical reactions of some metal oxides", *J. Mater. Chem.*, 11, 2001, pp. 851-820.

Zheng et al., "Laser-effected darkening in TPEs with $TiO_2$ additives", *Optics and Lasers in Engineering*, 41, 2004, pp. 791-800.

* cited by examiner

LASER MARKING PROCESS AND ARTICLES

The present invention relates to processes for laser-marking and to laser-marked articles.

BACKGROUND

Laser marking of polymer substrates is known. In some articles, a single layer in a multilayered substrate is marked by passing laser light through one or more layers that are "transparent" to the wavelength(s) of light generated by the laser. The substrate layer sensitive to the laser may simply char upon contact with the wavelength(s) of light emitted by the laser. In some instances, the markable layer can comprise a laser-sensitive pigment, dye or the like. However, the aforementioned "transparent" layers can still be damaged or modified in some way when exposed to the energy of the laser. Mild damage is often of no serious consequence where the transparent layer is merely decorative or serves a protective function for one or more underlying layers.

The exposure of multilayered substrates to laser light is more problematic where specific layers of materials possess performance properties important to the finished product, and the art has sought to avoid exposing such materials to laser light during the marking of another layer in the article. Layers of adhesive(s), release agent(s), or the like are exemplary of the functional materials which are not normally exposed to laser irradiation during such a marking process.

Additionally, traditional printing methods have not been satisfactory when used on layered materials that include, for example, a release agent. The application of a printed image to the surface of a layer of release agent is typically complicated by poor wetting and/or poor adhesion and can adversely impact the ability of the release agent to adhere to or to release from a pressure sensitive adhesive. Moreover, printing onto a surface prior to the application of a release agent can add steps to the manufacturing process and can adversely impact the ability of the release agent to adhere to the printed surface.

SUMMARY

It is desirable to provide a laser-marking process for marking multilayered materials. It is especially desirable to provide a process that performs the laser-marking through one or more functional materials to mark an underlying material without damaging the performance of the functional materials in the finished product. It is also desirable to provide laser-marked articles made according to the aforementioned process.

The present invention addresses the above-noted problems by providing a process for laser-marking and laser-marked articles, embodiments of which are described herein.

In a first aspect, a process is provided, comprising:

Providing a multilayered article comprising a laser-markable layer comprised of at least one organic polymer and at least one light-sensitive pigment, and at least one release agent associated with the laser-markable layer;

Laser-marking the laser-markable layer by directing laser radiation into the multilayered article through the at least one release agent to induce an interaction between the light-sensitive pigment and the organic polymer to form a visually perceptible marking in the article, the at least one release agent being transparent to the laser radiation.

In another aspect, an article is provided, comprising:

A laser-markable layer comprising a first major surface and a second major surface comprising at least one organic polymer and at least one light-sensitive pigment;

A first release agent associated with the first major surface of the laser-markable layer; and A marking in the laser-markable layer visible through the first release agent, the marking resulting from a laser-induced interaction between the at least one light-sensitive pigment and the organic polymer.

Unless otherwise indicated, scientific and technical terms used herein have meanings commonly used in the art unless otherwise specified. The definitions provided herein are to facilitate understanding of certain terms used frequently herein and are not meant to limit the scope of the present disclosure.

High-density polyethylene (HDPE) is a polyethylene thermoplastic having a density greater than about 0.940 g/cm$^3$.

Medium-density polyethylene (MDPE) is a polyethylene thermoplastic having a density within the range of 0.926-0.940 g/cm$^3$.

Low-density polyethylene (LDPE) is a polyethylene thermoplastic having a density less than about 0.926 g/cm$^3$.

Release Agent is a low surface energy material which, when applied to a surface of a disposable liner, provides a low surface energy interface between the liner and a pressure sensitive adhesive (PSA).

Release liner is a component of a pressure sensitive adhesive product which includes on one or both major surfaces a release agent and functions as a carrier to protect a surface of an adhesive. Liners can be extruded plastic films and can be made out of one single type of plastic material, a blend of different plastic materials or a multilayered coextrusion. As used herein, the terms "release liner," "liner," "release film" and "release sheet" are interchangeable.

Pressure sensitive adhesive (PSA) is adhesive which forms a bond with the application of relatively light pressure to marry the adhesive with an adherend.

Laser is an acronym for "light amplification by stimulated emission of radiation" and refers to a device that emits light (electromagnetic radiation) through a process called stimulated emission.

Laser radiation refers to the light emitted by a laser.

Laser marking refers to the use of laser radiation to create a visually perceptible image in a material, an article or a component thereof.

The invention will be more fully appreciated by those of ordinary skill in the art upon consideration of the various embodiments described herein including the embodiments that are specifically described in the detailed description, the drawings and the appended claims.

BRIEF DESCRIPTION OF THE DRAWINGS

In describing the embodiments of the invention, reference is made to the Figures wherein various features are identified and described using reference numerals, with like numerals indicating like features, and wherein.

Although the embodiments are described herein with reference to the Figures, it will be appreciated that the invention is not limited to the depicted embodiments and that the Figures and features depicted therein are not to scale.

DETAILED DESCRIPTION

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those of ordinary skill in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

In various embodiments, the present invention provides laser-marked multilayered articles and a process for making such articles using a laser. In various embodiments described herein, laser marking provides a visually perceptible image (e.g., a logo, trademark, company name, etc.) in at least one layer of a multilayered article by creating one or more marked areas resulting from a laser-induced interaction between a laser-sensitive pigment and a polymer in which the pigment is dispersed. In specific embodiments, the process uses a laser to mark an inner polymer layer within a multilayered article wherein at least one outer layer of the article comprises a release agent. In such embodiments, the laser penetrates through the release agent to mark the aforementioned polymer layer without causing substantial damage to the release properties of the release agent.

In some embodiments, the outermost layer(s) of the article is release agent(s) and the resulting laser-marked article is a release liner. In such embodiments, the release liners are marked to include a visually perceptible indicia of source (e.g., a logo, trademark, company name, etc. . . . ), a fanciful design, advertisement(s), product instructions, barcode or the like. When applied to a layer of a pressure sensitive adhesive (PSA), the laser-marked areas on the release liner remain visible.

Figure 1:
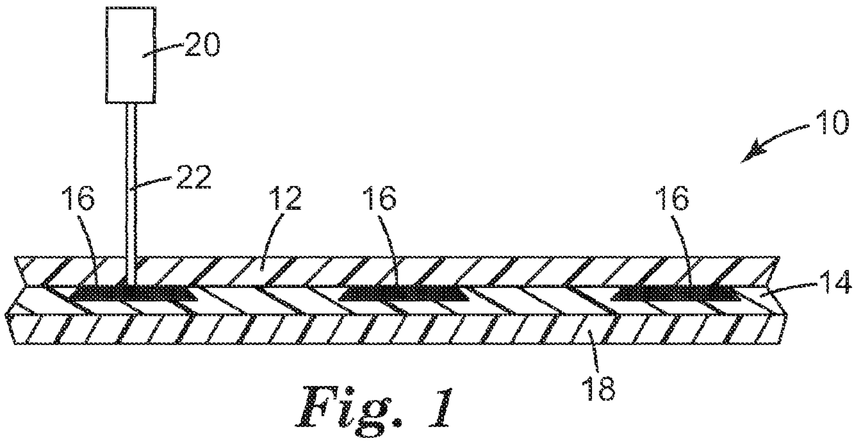
FIG. 1 is a schematic side view of an arrangement for selectively laser-marking a multilayered sheet.

Referring now to the Figures, FIG. 1 schematically depicts an embodiment of a laser marking process according to the invention. Laser-markable sheet or article 10 is conveyed in a single direction (e.g., indicated by the arrow) underneath a laser source 20 which emits a radiation of laser radiation 22 comprising a wavelength of light effective for creating the described marking. In some embodiments, article 10 is a continuous sheet of material conveyed to the laser source 20 from an unwind roll (not shown), for example. In other embodiments, the article 10 may comprise discrete or discontinuous pieces of material. Either as a continuous sheet or as discontinuous pieces of material, article 10 is a multilayered sheet that includes at least one laser-markable layer comprised of organic polymer and a laser-sensitive pigment. Laser radiation 22 is directed to laser-markable layer 14 of article 10, thereby initiating an interaction between the organic polymer and laser-sensitive pigment to create laser-marked area 16. Not intending to be bound by theory, it is believed that the aforementioned interaction may be a chemical reaction between the pigment and the surrounding polymer resulting in a product with laser-marked areas 16 in the form of indicia visible to the human eye. The laser-marked areas are typically darker in appearance than the surrounding portions of the same layer that comprise unreduced/unreacted pigment and polymer. Other additives or components may be present in the laser-markable layer 14 such as dyes or colorants and other components that are not considered to be sensitive to laser radiation.

Multilayered article 10 includes at least one top layer 12 coated over the underlying laser-markable layer 14, the top layer 12 being substantially transparent to the laser radiation 22 at the write wavelength. "Transparent," as used in this context, refers to a material that has little or minimal interaction with the laser. A laser radiation (e.g., radiation 22) will pass through transparent material with little to no observable damage to that material.

In some embodiments, an optional third or bottom layer 18 is included. Bottom layer 18 may comprise a layer of release agent which may be the same as or different than the release agent of top layer 12. The release agent(s) and the laser are selected to be compatible in that exposure to the laser does not materially effect the ability of the release agent to function. In other words, the release agent is not functionally damaged by exposure to laser radiation. The peel test described in the Examples herein is one method for determining whether a release agent's release properties are significantly changed after exposure to a laser. When the aforementioned peel test is utilized, release agents used in embodiments of the present invention may experience a moderate initial change in peel strength following exposure to a laser, but will still function in a manner acceptable to those of ordinary skill in the art. In embodiments where a change in peel strength from release agent is observed, the change will typically be no more that about 500%, or no more than about 100% and in some embodiments no more than about 10%. In other words, the peel strength for a release agent following exposure to laser radiation is no more than about 600% of its initial value, in some embodiments no more than about 200%, and in some embodiments, no more than about 110%.

In an alternate arrangement, the laser-markable layer 14 may be marked using a laser mounted beneath the multilayered article 10 and directed through optional bottom layer 18. In such an arrangement, optional bottom layer 18 (e.g., a release agent) is selected to be transparent to the laser, as previously discussed.

Figure 2:
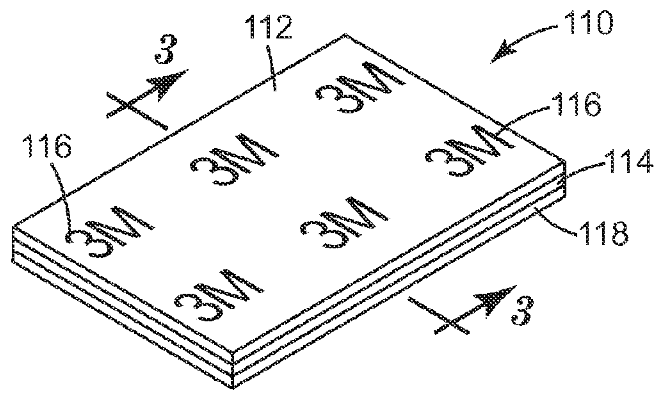
FIG. 2 is a perspective view of a portion of a multilayered film that has been laser-marked according to a first embodiment of the invention.
Figure 3:
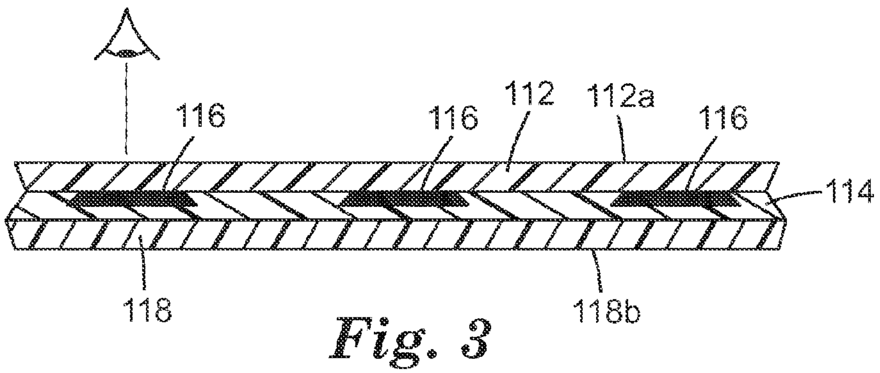
FIG. 3 is a side elevation of the multilayered film of FIG. 2.
Figure 4:
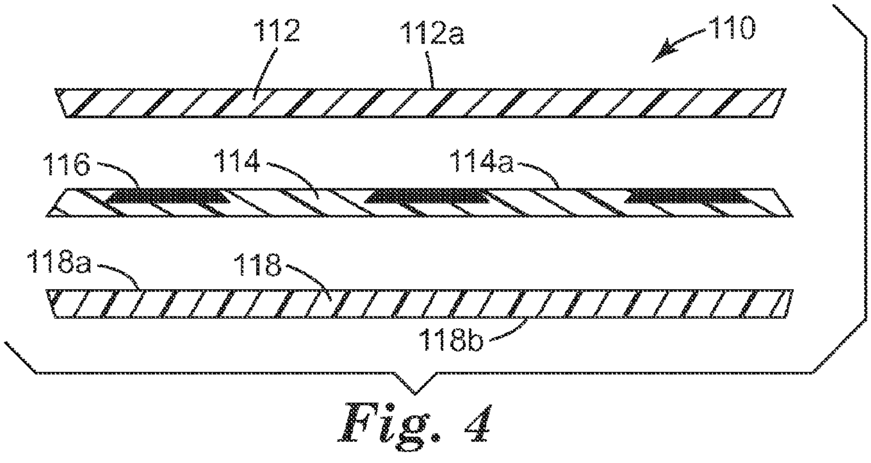
FIG. 4 is an exploded view of the multilayered film of FIG. 3.

Referring to FIG. 2-4, a laser-marked multilayered article 110 is schematically depicted. In the depicted embodiment, multilayered article 110 is similar to article 10 of FIG. 1 and comprises a multilayered sheet having three layers, a top or first layer 112, a laser-markable layer 114 which includes a plurality of laser-marked areas 116, and a third or bottom layer 118. Each of the marked areas 116 is the result of a laser-induced interaction of materials within the laser-markable layer 114. In FIG. 2, laser-marked areas 116 are depicted in the form of the brand "3M" owned by 3M Company, St. Paul, Minn. Top layer 112 (e.g., see FIG. 3) comprises material that is transparent to the laser radiation, as previously described. Moreover, top layer 112 is visually or optically transparent in the sense that the marked areas 116 in laser-markable layer 114 are observable through the top layer 112.

Each of the layers in article 110 include first and second major surfaces. Top layer 112 has a first or upper surface 112*a* and a second or lower surface 112*b*. Similarly, laser-markable second layer 114 includes first or upper surface 114*a* and second or lower surface 114*b*. Bottom layer 118 has a first or upper surface 118*a* and a second or lower surface 118*b*. In various embodiments, the different layers 112, 114 and 118 of the article 110 comprise different materials. In some embodiments, top layer 112 comprises a release agent applied to the first major surface 114*a* of laser-markable layer 114. Layer 114 comprises organic polymer and laser-sensitive pigment compounded and substantially uniformly dispersed within the polymer.

Optional bottom layer 118 may comprise a second release agent which may be the same as or different than the release agent of top layer 112. In such embodiments, bottom layer 118 may be selected to be transparent to a laser so that laser-markable layer 114 may be marked through the bottom layer 118, and bottom layer is also visually or optically transparent in the sense that the marked areas 116 are observable through the bottom layer.

Figure 7:
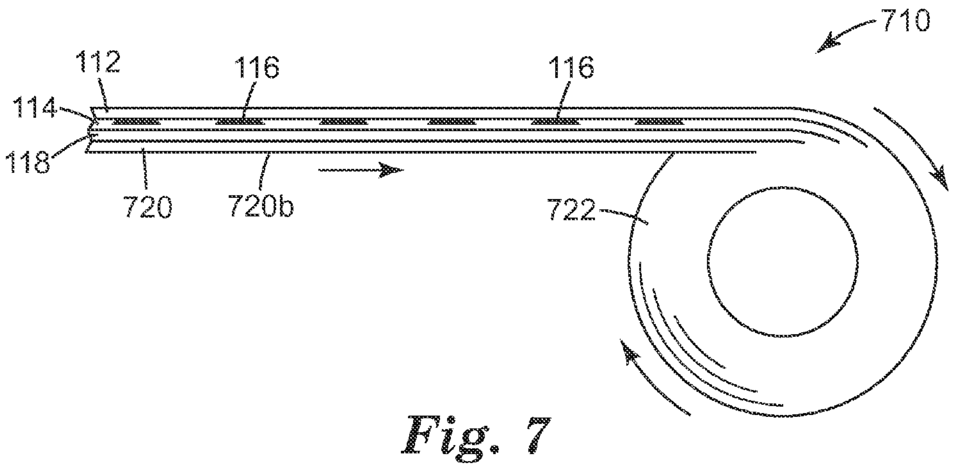
FIG. 7 is a side elevation of a multilayered film and illustrating a rolling operation.

In embodiments wherein both top layer 112 and bottom layer 118 comprise release agent(s), article 110 may be used as a release liner capable of being releasably attached to a layer of pressure sensitive adhesive (PSA). Where article 110 is a continuous sheet of material, a layer of PSA may be applied to the second or bottom surface 118*b* of layer 118. Referring to FIG. 7, a continuous article 710 is shown comprising 3 layers with a PSA layer 720 applied to release agent 118. The continuous article 710 may be configured into roll form by curling or rolling an end of the article in the direction of the curved arrow so that upper surface 112*a* of top layer 112 (a release agent) becomes adhered to the bottom surface 720*b* of PSA layer 720. The entire length of the continuous article 710 may be wound into a roll 722 which may then be stored or it may be transported to another location for further processing. In such an embodiment, the release agents of layers 112 and 118 are selected to have peel strengths to permit the rolled article to later be unrolled so that PSA layer 720 preferentially releases first from the surface of release agent or surface 112*a* of top layer 112. The exposed surface 720*b* of the PSA layer 720 may then be applied to another surface, and, when so applied, laser-marked areas 116 will remain visible to an observer through top layer 112. Bottom layer 118 comprises release agent, thus allowing the laser-markable layer 114 to be subsequently peeled from surface 720*a* of PSA layer 720 with relative ease.

In another embodiment, a layer of PSA is applied over the release agents in either or both of the top layer and bottom layer, and the laser-markable layer may be marked with a laser through both multiple layers of PSA and release agent.

In still another embodiment, the multilayered article includes no bottom layer of release agent, and a layer of PSA is applied directly to the bottom surface of the laser-makeable layer to thereby provide a substrate-backed adhesive tape. The exposed surface of the PSA layer may then be adhered to another surface and, when so applied, the laser-marked areas will remain visible through the top layer of the article.

Figure 5:
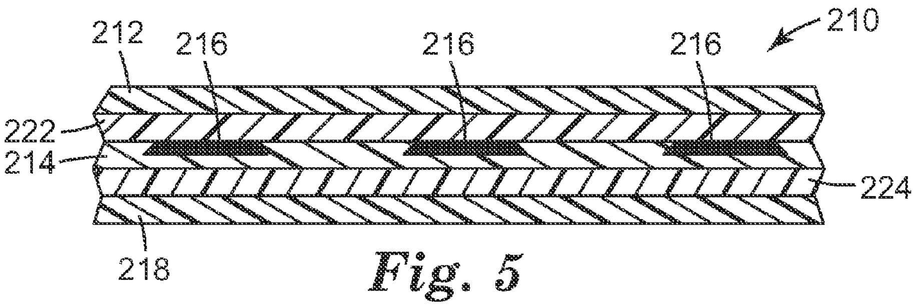
FIG. 5 is a side elevation of a multilayered film that has been laser-marked according to a second embodiment of the invention.
Figure 6:
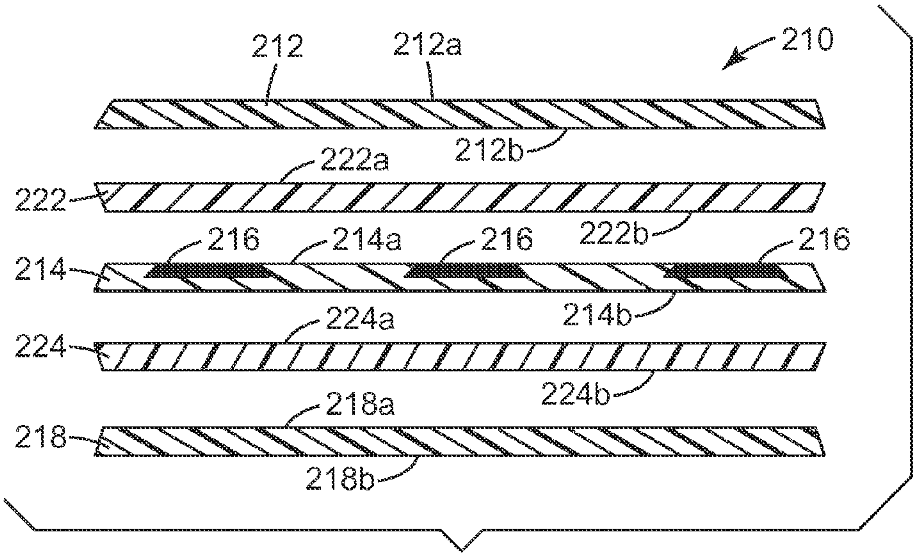
FIG. 6 is an exploded view of the multilayered film of FIG. 5.

Referring to FIGS. 5 and 6, another embodiment of a multilayered laser-marked article 210 is depicted. The article 210 is similar to the previously described article 110 but incorporates additional layers of material. Article 210 includes five layers of sheet-like materials. The laser-markable layer 214 includes marked areas 216 similar to layer 114 and marked areas 116 previously described, layer 214 including upper surface 214*a* and lower surface 214*b*. Additionally, the top and bottom layers 212 and 218 of the article 210 are similar to top layer 112 and bottom layer 118, respectively. Top layer 212 including upper surface 212*a* and lower surface 212*b*, and bottom layer 218 including upper surface 218*a* and lower surface 218*b*. Moreover, either one or both of the top and bottom layers 212 and 218 may comprise release agent, as previously described.

Article 210 also includes intermediate layers 222 and 224 on either side of laser-markable layer 214. Intermediate layer 222 is disposed within the article 210 between top layer 212 and the laser-markable layer 214. Layer 222 includes an upper surface 222*a* and a lower surface 222*b*. Intermediate layer 224 is disposed between bottom layer 218 and laser-markable layer 214. Intermediate layer 224 includes upper surface 224*a* and lower surface 224*b*. In various embodiments, either or both intermediate layers 222 and/or 224 comprise organic polymer. In some embodiments, the organic polymer for either layer will be the same as the organic polymer used in the laser-markable layer 214.

It will be appreciated that embodiments are contemplated wherein the multilayered article comprises a plurality of layers having still more material layers than previously described herein. Depending on the properties desired and the end use of the article, any number of such layers may be included in the article so long as the article comprises a laser-markable layer, as previously described, and the layers of material coated over the laser-markable layer are transparent to the laser being used to mark the article.

Suitable materials for use in the laser-markable layer include any of a variety of film-forming polymers compatible with laser-sensitive pigment. In the various embodiments of the invention, at least one laser-sensitive pigment is substantially homogenously dispersed within the organic polymer of a laser-markable layer. Suitable laser-sensitive pigments include one or more metal oxides such as crystalline (e.g., rutile) titanium dioxide ($TiO_2$). Commercially available titanium dioxides are suitable for use in the various embodiments of the invention including those available from E. I. du Pont de Nemours and Company ("DuPont") of Wilmington, Del. In particular, the titanium dioxides available from DuPont under the "Ti-Pure" trademark such as the product designated "Ti-Pure R-902+" may be used. Minor amounts of silica ($SiO_2$), alumina ($Al_2O_3$) and/or aluminum hydroxide may be present in the titanium dioxide. Typically, silica, alumina and/or aluminum hydroxide are present in the form of an outer coating that surrounds each particle of $TiO_2$. In embodiments wherein titanium dioxide is used as the laser-sensitive pigment, the titanium dioxide is typically present in the organic polymer at a concentration of less than about 10% by weight, based on the total weight of the laser-markable layer. In some embodiments, titanium dioxide is present in the organic polymer at a concentration less than about 5% by weight or less than about 1% by weight. In still other embodiments, the titanium dioxide is present at concentrations less than about 0.5% by weight based on the total weight of the laser-markable layer. Higher or lower concentrations of titanium dioxide may also be suitable.

Regarding organic polymer materials, any of a variety of thermosetting organic polymers as well as thermoplastic organic polymers may be suitable and are contemplated within the scope of the invention. Polymeric materials suitable for use are discussed below, and it will be appreciated that such materials are often compounded with any of a variety of additives and/or fillers such as plasticizers, antidegradants, dyes, and the like. In the various embodiments of the present invention, the polymeric materials used to form a laser-markable layer are compounded with a measured amount of laser-sensitive pigment (e.g., titanium dioxide), as previously described.

Examples of suitable organic polymers include polyolefin materials such as polyethylene. Suitable polyethylene polymers include low density polyethylene (LDPE), medium density polyethylene (MDPE), high density polyethylene (HDPE) and combinations of two or more of the foregoing. In some embodiments, the laser-markable layer comprises HDPE and the top and bottom layers comprise release agent. In some embodiments, the laser-markable layer again comprises HDPE with top and bottom layers comprising release agent, and intermediate layers (e.g., similar to layers 222 and 224 of FIGS. 5-6) comprising LDPE, MDPE or both. In some embodiments, one intermediate layer is LDPE and the other intermediate layer is MDPE.

In some embodiments, suitable organic polymers for use in the laser-markable layer include any film forming polymer so long as it is capable of supporting a layer of release agent. Suitable polymeric films include those made from polyamide (e.g., Nylon); polyesters such as polyethylene terephthalate (PET); polyacetal; polycarbonate and the like are well suited for this application. Polyethylene terephthalate is the most common thermoplastic polyester and is commonly referred to as "polyester." Variations such as polyethylene naphthalate, polybutylene terephthalate, and copolyesters such as polyethylene terephthalate isophthalate are also suitable for use in various embodiments of the invention. In a broader sense, any polyester film based on a polymer resulting from polycondensation of a glycol or diol with a dicarboxylic acid (or its ester equivalents) such as, for example, terephthalic acid, isophthalic acid, sebacic, malonic, adipic, azelaic, glutaric, suberic, succinic acids or mixture of two or more of the forgoing are suitable for use in the present invention. Suitable glycols include, for example, ethylene glycol, diethylene glycols, polyethylene glycols, and polyols such as butanediol and mixtures of two or more of the foregoing.

Polyethylene terephthalate (PET) is widely known in the form of biaxially oriented and thermally stabilized films usually referred to by their main brand names Mylar® (Dupont Teijin Films U.S. Limited Partnership, Chester, Va., 23836), Melinex® (Dupont Teijin Films U.S. Limited Partnership, Chester, Va., 23836), Teijin® (Dupont Teijin Films U.S. Limited Partnership, Chester, Va., 23836), Lumirror® (Toray Plastics (America), Inc., North Kingstown, R.I. 02852) or Hostaphan® (Mitsubishi Polyester Film, Inc., Greer, S.C. 29652), etc. and are commercially available.

Additives may be blended into a polymer resin prior to forming a film or layer by extrusion or the like. In extrusion operations, the additives may be added directly to the extruder. Exemplary additives include fillers such as silica, calcium carbonate, kaolin etc, colorants (e.g., dyes or pigments), slip agents, anti-blocking agents, processing aides, anti-oxidants, antistatic agents, laser-sensitive pigments (e.g., titanium dioxide) and the mixture thereof.

In some embodiments, materials other than polymer films may be desired for use in the laser-markable layer. Exemplary of such materials include nonwoven substrates, woven substrates, cellulosic materials (e.g., paper), and the like. Fibers suitable for inclusion in such woven and nonwoven materials include the aforementioned polymers as well as cellulosic materials, such as paper.

All the above mentioned substrates can be treated before applying the release agent.

In embodiments comprising one or more intermediate layers (e.g. layers 222 and 224 of FIG. 5), the intermediate layers comprise materials that are transparent to the write wavelength of the laser being used to mark the article. While the laser-markable layer comprises laser-sensitive pigment, the intermediate layers typically comprise no laser-sensitive pigment. In some cases, the intermediate layers can provide a thermal buffer or heat barrier between the laser-markable layer and a release agent in the outermost layer(s). In some processes, marking of the laser-markable layer may generate excess heat during the laser-induced interaction between the pigment and organic polymer, and the presence of intermediate layers can provide a thermal buffer to protect against thermal degradation of release agent or adhesive in the outer layers of the article.

In some embodiments, suitable organic polymer for one or more of the layers in a laser-marked article can comprises a thermoplastic elastomeric olefin (TEO). Thermoplastic elastomeric olefins (TEOs), also known in the art as thermoplastic polyolefins (TPOs), are both thermoplastic and elastic in nature. TEO is typically a blend of a rubber material, such as, for example, an ethylene propylene rubber (such as ethylene-propylene monomer [EPM] or ethylene-propylene-diene-monomer [EPDM]), a nitrile rubber, or a styrene butadiene rubber, combined with a thermoplastic (such as polypropylene, polyethylene, or polyvinyl chloride), and may also be compounded with any of a variety of additives and/or fillers such as plasticizers, antidegradants, fillers, dyes, and the like.

TEO is commercially available, typically as a blend of polypropylene and EPDM. Alternatively, the TEO can be formed by copolymerizing thermoplastic, such as polypropylene, with a rubbery material, such as ethylene-propylene rubber. The rubbery material can optionally be vulcanized.

The relative proportion of thermoplastic to rubbery material in a TEO can range from about 15% by weight thermoplastic to about 85% thermoplastic, and about 85% rubbery material to about 15% rubbery material, respectively. TEOs are typically formulated to produce the desired end-use characteristics. A TEO with a higher amount of thermoplastic can be more brittle. TEO having a high amount of rubbery material will tend to have properties more similar to the pure rubber. In embodiments of the invention wherein the laser-marked article is to be used as a release liner, various TEOs may be selected to provide the liner with physical characteristics suitable to permit the liner to be peeled from a layer of PSA after the PSA has been adhered to a substrate. In some embodiments, TEO comprises from about 30% to about 70% by weight thermoplastic and about 70% to about 30% rubbery material or from about 40% to about 60% by weight thermoplastic and about 60% to about 40% by weight rubbery material.

Suitable commercially available TEOs include those available under the DEXFLEX trade name from D & S Plastics Intl. (Auburn Hills, Mich.), those under the ALCRYN trade name available from DuPont Co. (Wilmington, Del.), those under the MULT-FLEX trade name available from Multibase (Copley, Ohio), and those under the POLYTROPE TPP trade name available from A. Schulman (Akron, Ohio). The grade of TEO is selected for the type of processing that will be used to make the release liner, and is preferably an extrusion grade, such as DEXFLEX SB-814 available from D & S Plastics Intl. Commercially available TEOs may include other additives such fillers, processing aids, plasticizers, and the like.

Multilayered articles according to the invention can be made by known processes such as blown film extrusion or coextrusion for films having multiple layers and sheet extrusion or coextrusion. The films can be made in thicknesses of about 0.0005 inch (0.013 mm) to about 0.010 inch (0.25 mm), and preferably in thicknesses of about 0.001 inch (0.025 mm) to about 0.008 inch (0.2 mm). Thinner films may be desired for cost considerations, while thicker films can provide increased tear resistance, tensile strength, and the like. In some embodiments, a multilayered article may be made first by extrusion or co-extrusion, and the resulting surfaces of the extruded article may be subsequently coated with one or more additional layer of material.

Layers of release agent can be applied during the film manufacturing process before it is heat set, and by known in-line coating or by off-line processes (after manufacturing and heat setting of the film). Conventional off-line coating processes include roll coating, reverse roll coating, gravure roll coating, reverse gravure roll coating, brush coating, wire-wound rod (Meyer rod) coating, spray coating, air knife coating, or dipping which can be from solvent based solutions, solventless or water based emulsions.

While surface modification of the base polymer film prior to coating is not required, the surface or surfaces of the base polymer film may be modified before application of the coatings of the present invention. Conventional surface modification techniques include corona treatment to enhance coating adhesion. The corona treatment or other surface modification should be sufficient to permit wetting out of the coating. In addition, primer or other intermediate layers can optionally be used between the polymer film and the release coating.

Additives may be blended into the polymer resin prior to extrusion, or they may be added directly to the extruder. Exemplary additives include fillers, colorants (e.g., dyes or pigments), slip agents, anti-blocking agents, processing aids, laser-sensitive pigment (e.g., titanium dioxide) and the like. Colorants are typically used in amounts of about 0.1% to about 5% by weight of the film composition, and in some embodiments from about 0.3% to about 3%.

Anti-blocking agents are particularly useful for outer layers of polyethylene to prevent sticking or blocking between layers of polyethylene when the extruded film is wound onto a roll. Useful materials include diatomaceous earth either by itself or in a low density polyethylene binder. Anti-blocking agents may be included in amounts of from about 1% to about 20% by weight of the polyethylene resin, and preferably in amounts of from about 3% to about 8%.

While polyethylenes are useful as the main polymer component in the laser-markable layer of the articles described herein, they are also useful as processing aids to enhance the extrusion and film flatness of TEO resins. Various polyethylenes can optionally be blended with the TEO to provide the resulting film with desired release characteristics. In such applications, any type of polyethylene may be used, including low density polyethylene and linear low density polyethylene. The polyethylenes can be used in amounts from about 1% to 99% by weight, and in some embodiments, in amounts of about 15% or greater.

In one embodiment, a laser-markable article is provided as a release liner comprising a laser-markable layer of TEO and titanium dioxide to which a release coating or layer is or can be applied. The TEO in the laser-markable layer can be mixed or blended with one or more other polymers such as polyethylene. In such an embodiment, TEO is present in the laser-markable layer at a concentration from about 5% by weight to about 100% by weight TEO, and more preferably from about 10% to about 100% TEO. The selection of the relative amounts of TEO and other polymer may be determined by those of ordinary skill in the art by knowing the end properties needed for the release liner, e.g., tensile strength, tear resistance, etc. The release coating (described in more detail below) is or can be applied to one or both sides of the TEO film core, depending upon the intended use and the release characteristics desired. When included, a layer of release agent is in the form of a layer that can constitute from about 7% to about 15% of the total thickness of the release liner.

When included with a PEO, polyethylene may comprise LDPE, MDPE, HDPE or a blend of two or more of the foregoing. The selection of the material depends upon the desired release properties. Polyethylenes of different densities can be blended together, or they can be blended with ethylene co-polymers to provide the desired properties. For example, a blend of high density polyethylene with a low density polyethylene can be used to make a medium density polyethylene having intermediate release values between high and low density polyethylenes.

Another useful polyethylene for use with TEO is a very low density polyethylene formed as a copolymer of ethylene and an alpha olefin having from about 3 to about 10 carbon atoms using a metallocene polymerization catalyst. Suitable alpha-olefins include butene-1, hexene-1, octene-1, and combinations thereof. The copolymers have a density of less than about 0.90 g/cc, preferably less than about 0.89 g/cc, and more preferably, less than about 0.88 g/cc. The copolymers also have a narrow molecular weight distribution as defined by having a polydispersity of about 1 to about 4, and preferably about 1.5 to about 3.5. The polydispersity is defined as the ratio of the weight average molecular weight to the number average molecular weight. Additionally, the copolymers can be characterized by a composition distribution breadth index (referred to hereinafter as "CDBI"). The CDBI is defined as the weight percent of the copolymer molecule having a co-monomer content within 50 percent (i.e., +/−50%) of the median total molar co-monomer content. The CDBI and the method for its determination is described in U.S. Pat. No. 5,206,075. The CDBI of suitable copolymers is preferably greater than 70% and more preferably greater than 80%. Suitable copolymers are commercially available from Exxon Chemical Co. under the EXACT tradename and from Dow Chemical Co. under the ENGAGE trade name.

Release agent is included in the articles of the invention to provide a means to "release" or separate a multilayered laser-marked article from a sticky material such as a PSA. A release agent's ability to provide release can be determined by known testing methods such as the peel testing method described in the Examples herein. Suitable release agents for use in the various embodiments are those that retain their ability to provide release after exposure to laser radiation used to mark a laser-markable layer. Suitable release agents may comprise any of a variety of know release agents such as are described in various sources including patent literature. Release agents include polyolefin (e.g., polyethylene or polypropylene as described in U.S. Pat. No. 6,982,107), silicones (e.g., polysiloxanes), fluorosilicons (e.g., as in U.S. Pat. No. 4,968,766 to Kendziorski), perfluoroethers (e.g., U.S. Pat. No. 4,830,910 to Larson, U.S. Pat. No. 4,472,480 to Olson), fluorocarbons (e.g., U.S. Pat. No. 7,345,123 to Kumar)), polymers with long alkyl side chains (U.S. Pat. No. 6,660,354 B2 to Suwa), and the like.

Release agents, including those previously mentioned, are commercially available from suppliers, including Momentive Performance Materials (Albany, N.Y.), Dow Corning under its SYL-OFF® brand (Midland, Mich.), Wacker Silicones (Wacker Chemical Corporation, Adrian, Mich.), Evonik Goldschmidt Corporation (Hopewell, Va.), and Bluestar Silicones USA Corp. (Rock Hill, S.C.) etc. Release coated liners are commercially available from Loparex (Willowbrook, Ill.), Mondi Akrosil, LLC. (Menasha, Wis.), Mitsubishi Polyester Film, Inc., (Greer, S.C.), Huhtamaki (Forchheim, Germany), Siliconature (Chicago, Ill.), and other companies.

Release agents can be applied to the laser-markable layer as solvent or water-based coatings, solventless coatings, hot melt coatings, or they can be co-extruded with the laser-markable layer using conventional processes. Solvent and water-based coatings are typically applied by processes such as roll coating, knife coating, curtain coating, gravure coating, wound rod coating, and the like. Solvent or water is removed by drying in an oven, and the coating is optionally cured in the oven. Solventless coatings include 100% solids compositions such as silicones or epoxy silicones which are applied using the same types of processes used for solvent based coatings. The coatings may be cured by exposure to ultraviolet light.

Optional steps may be desired prior to the application of a release agent including priming or surface modification (e.g., corona treatment) of the laser-markable layer. Hot melt coatings such as polyethylenes or perfluoroethers are typically 100% solids coatings which are heated and then applied through a die or with a heated knife. Hot melt coatings may be applied by co-extruding the release material with the laser-markable layer.

The laser-markable layer can be coated with release agent on one or both sides to provide a release liner having the construction of the article 110 (FIGS. 2-4). As a release liner, adhesive (e.g., PSA) is applied to one or both of the release agents. The amount of release force, e.g., the force required to remove the liner from the adhesive, can range from almost zero to about 500 grams per centimeter or higher, as determined by the peel test method described in Examples 1-4 herein. When the release force is on the higher end of the range, i.e., above about 300 grams per centimeter, it may be difficult to start removal of the liner and to continue the removal of the liner once a part has been removed from the adhesive. The lower end of the removal force range, e.g., less than about 50 grams per centimeter is more typical with silicone coatings. The release surface of a release liner according to the invention exhibits a release value of less about 500 grams per centimeter width, less than about 100 grams per centimeter, or less than about 20 grams per centimeter width.

When both sides of a multilayered laser-marked article are coated with release agent, the release agents on each side of the article may be the same or they may be different to provide a differential release. For differential release, the release agent will have a higher release force on one side than the other. For example, one side of an article may be coated with a silicone release agent having a release force from a pressure sensitive adhesive of no more than 100 grams per centimeter of width and the other side may have a silicone release agent having a release force of 300 grams per inch of centimeter. In some applications, differential release ensures that the PSA will adhere more tightly to one side of the liner than the other so that when a roll of the multilayered laser-marked article is unwound, the adhesive consistently stays on the same side of the article.

The multilayered laser-marked article described herein is useful with any type of PSA. This includes PSAs based on acrylate or acrylics, polyesters, silicones, block copolymers, ethylene vinyl acetate, and the like. The selection of the release agent may depend upon the type of PSA to which it is adhered. For example, release surfaces of polyethylene, polypropylene, perfluoroethers, and silicone are useful with acrylate pressure-sensitive adhesives, and perfluoroethers are useful for silicone pressure-sensitive adhesives.

Useful PSAs include acrylic adhesives, natural rubber adhesives, tackified block copolymer adhesives, polyvinyl acetate adhesives, ethylene vinyl acetate adhesives, silicone adhesives, polyurethane adhesives, thermosettable pressure-sensitive adhesives such as epoxy acrylate or epoxy polyester pressure-sensitive adhesives, and the like. These types of pressure-sensitive adhesives are known in the art and are described in the *Handbook of Pressure Sensitive Adhesive Technology*, Satas (Donatas), 1989, 2nd edition, Van Nostrand Reinhold, as well as in the patent literature. PSAs may also include additives such as cross-linking agents, fillers, gases, blowing agents, glass or polymeric microspheres, silica, calcium carbonate fibers, surfactants, and the like. The additives are included in amounts sufficient to effect the desired properties.

In some embodiments, heat-stable PSAs may be used with the multilayered laser-marked article of the invention including acrylate pressure-sensitive adhesives such as, for example those described in Re 24906 (Ulrich), U.S. Pat. No. 4,181,752 (Martens et al.), U.S. Pat. No. 4,818,610 (Zimmerman et al.). In some embodiments, silicone pressure-sensitive adhesives may be used. Adhesives can be purchased commercially or prepared using known methods including emulsion polymerization, solvent polymerization, e-radiation polymerization, ultraviolet light polymerization, and the like. Typically, acrylate adhesives are homopolymers and copolymers of monofunctional unsaturated acrylic or methacrylic acid ester monomers of non-tertiary alcohols having from about 1 to about 20 carbon atoms, and preferably from about 4 to about 12 carbon atoms. A co-monomer may optionally be included to improve the cohesive strength of the adhesive. Such reinforcing co-monomers useful in making the copolymers typically have a higher homopolymer glass transition temperature than the glass transition temperature of the acrylic acid ester homopolymer.

Suitable acrylic acid ester monomers include 2-ethylhexyl acrylate, isooctyl acrylate, isononyl acrylate, n-butyl acrylate, decyl acrylate, dodecyl acrylate, octadecyl acrylate, and mixtures thereof. Useful reinforcing co-monomers include acrylic acid, methacrylic acid, itaconic acid, acrylamide, substituted acrylamides, N-vinyl pyrrolidone, N-vinyl caprolactam, isobornyl acrylate, and cyclohexyl acrylate.

In a typical process to make pressure sensitive adhesive transfer tapes, an adhesive composition is coated onto a laser-marked article, as previously described. The adhesive is cured to form a gelled film on the laser-marked article, and the article with the adhesive is rolled up into a large roll. Alternatively, the adhesive may be coated and cured on one liner, and then transferred onto a different liner before converting. The adhesive coated sheet is then converted into narrow rolls by slitting the large roll and winding the narrow width tape onto cores for customer use. The liners of the invention can also be used with foam tapes such as 5605 and 5344 Acrylic Foam Tapes available from 3M Company (St. Paul, Minn.), as well as double coated tapes.

Regarding the laser, commercially available lasers are suitable for the process described herein. In some embodiments, a suitable laser device emitting ultraviolet (UV) or visible electromagnetic radiation is used. In various embodiments, a laser emitting radiation having a wavelength less than about 550 nm is suitable, and in some embodiments, less than about 360 nm.

EXAMPLES

The following non-limiting Examples further illustrate embodiments of the present invention. The particular materials used and amounts thereof recited in these examples, as well as other conditions and details, are to not to be interpreted narrowly or in a manner that limits the scope of the invention. All parts, percentages, ratios, etc. in the examples are by weight, unless noted otherwise.

Materials

PT1100: 1.14 mm (45 mil) thick acrylic foam tape having a GL-1 release liner available from 3M Company, St. Paul, Minn.

GL-1: A 0.114 mm (4.5 mil) thick red release liner comprising three layers of coextruded polyethylene: a first outer layer, a second outer layer, and an interior layer. The first outer layer has a first silicone coating and the second outer layer has a second silicone coating. The interior layer contains about 0.4% titanium dioxide, while the first and second outer layers do not contain titanium dioxide. The GL-1 release liner is available as a component of PT1100 from 3M Company, St. Paul, Minn.

AFT 5344: Acrylic Foam Tape 5344 available from 3M Company, St. Paul, Minn.

AFT 5605: Acrylic Foam Tape 5605 having Loparex PE release liner available from 3M Company, St. Paul, Minn.

Loparex PE: White release liner comprising three layers of coextruded polyethylene with titanium dioxide in the center layer. The liner has a first outer surface coated with a first silicone and a second outer surface coated with a second silicone. The liner is available as HDPE 0.005 SILICONE C2S (8100A/8250) WHITE from Loparex LLC, Iowa City, Iowa where 8100A refers to the first silicone and 8250 refers to the second silicone. The release liner is also available as a component of AFT 5605.

Examples 1-4

A GL-1 release liner was obtained by hand peeling the acrylic foam layer from a PT1100 acrylic foam tape.

A 355 nm laser (commercially available as Coherent Avia, from Coherent, Inc. Santa Clara, Calif.) was used to mark the liner through the first silicone layer. The pulse width of the laser was about 30 ns and the laser average output power was set to 1 watt (Example 1). A mark was created in the interior polyethylene layer by making lines of adjacent dots about 30 microns in diameter with a laser pulse rate of 20 KHz, a speed of 1 m/s and a laser spot size of about 30 microns. A 10 cm×10 cm area was marked with lines having a center to center spacing between lines of 100 microns. Additional samples were made where the laser average power was reduced to 0.28 watt output (Example 2), and samples were made where the marking was applied through the second silicone layer (Examples 3 and 4 with the average laser power set to 1 watt in Example 3 and to 0.28 watts in Example 4).

To test the effect of the laser mark on the release functionality of the release layer, peel tests were conducted as follows. Samples were prepared by laminating the release side or surface of the liner to the adhesive side of a pressure sensitive adhesive tape (AFT 5344) using a hand roller to eliminate air pockets. The other side of the tape was protected with a standard polyethylene release liner. Strips measuring 1.27 cm (0.5 inch) wide by 17.8 cm (7 inches) long were cut and then aged for 7 days at room temperature (about 20-25° C.) and tested, or aged at 70° C. for 3 days or for 7 days and tested. To perform the test, the standard polyethylene liner was removed and the adhesive tape was laminated to the bed of an IMASS Adhesion Tester (Imass Inc. Hingham, Mass.). The liner was then pulled away from the adhesive at a 180 degree angle and a speed of 30 cm/minute. The peel direction was parallel to the direction of the lines that were laser marked in the release liner. The force required to remove the liner was recorded in grams per 1.27 cm of width (g/0.5 inch) and then scaled to grams per cm. Control samples were also made that did not have a laser marking. In all cases, the adhesive separated from the liner at the release surface with no detectable adhesive remaining on the release liner. The results of the peel tests are shown in TABLE 1.

TABLE 1

| Example | Initial Release (g/cm) Treated Area | Initial Release (g/cm) Control Area | 7 days @ RT (g/cm) Treated Area | 7 days @ RT (g/cm) Control Area | 3 days @ 70° C. (g/cm) Treated Area | 3 days @ 70° C. (g/cm) Control Area | 7 days @ 70° C. (g/cm) Treated Area | 7 days @ 70° C. (g/cm) Control Area |
|---|---|---|---|---|---|---|---|---|
| 1 | 14.8 | 13.0 | 20.9 | 16.5 | 31.3 | 34.0 | 36.5 | 37.0 |
| 2 | 9.3 | 11.0 | 15.1 | 15.1 | 30.2 | 29.5 | 31.8 | 47.6 |
| 3 | 40.6 | 41.6 | 50.3 | 48.6 | 95.0 | 87.5 | 158.5 | 123.8 |
| 4 | 38.0 | 39.8 | 45.7 | 45.9 | 85.5 | 85.3 | 116.1 | 122.8 |

Examples 5-9

A 355 nm laser (commercially available as Coherent Avia, from Coherent, Inc. Santa Clara, Calif.) was used to mark Loparex PE and GL-1 release liners. The pulse width of the laser was about 30 ns and the focused laser spot size was about 30 microns. The laser pulse repetition rate was 20 KHz, a scanning speed of 1 m/s was used.

Marks were made through the 8100A side of a Loparex PE release liner attached to an ATF 5605 tape using average laser power settings of 1 watt (Example 5), 0.5 watts (Example 6), and 0.28 watts (Example 7). A GL-1 release liner was obtained by hand peeling the acrylic foam layer from a PT1100 acrylic foam tape. Marks were made through the first silicone coating of the GL-1 release liner (Example 8) and through the second silicone coating of the GL-1 release liner (Example 9) using an average laser power of 1 watt. The line pattern produced by the laser marking was the same as in Examples 1-4 for both the Loparex PE and GL-1 liners.

Peel tests for Examples 5-7 were performed by adhering the AFT 5605 tape having the marked release liner to an aluminum panel. An Instron 5565 (available from Instron, Norwood, Mass.) was used to conduct the tests. Three separate 2.54 cm (1 inch) wide strips of AFT 5344 tape was applied to the release liner with the adhesive side of the AFT 5344 in contact with the laser marked side of the release liner. The ATF 5344 tapes and the release liner were pressed together by making four passes with a 2.04 kg (4.5 lb) roller. Each strip of ATF 5344 tape was pulled away from the release liner at a 90 degree angle and the force required to remove each AFT 5344 tape from the liner was determined in grams per 2.54 cm of width (g/inch), the force for each of the three strips was averaged, and then scaled to grams per cm. In all cases, the adhesive separated from the liner at the release surface with no detectable adhesive remaining on the release liner.

Peel tests for Examples 8 and 9 were performed as in Examples 1-4, except that 2.54 cm (1 inch) wide strips were used and the tape was pulled from the liner at a 90 degree angle. In both cases, the adhesive separated from the liner at the release surface with no detectable adhesive remaining on the release liner.

All peel test data are shown in TABLE 2.

TABLE 2

| Example | Initial Release (g/cm) Treated Area | Initial Release (g/cm) Control Area | 1 day @ RT (g/cm) Treated Area | 1 day @ RT (g/cm) Control Area | 1 day @ 70° C. (g/cm) Treated Area | 1 day @ 70° C. (g/cm) Control Area | 3 days @ 70° C. (g/cm) Treated Area | 3 days @ 70° C. (g/cm) Control Area |
|---|---|---|---|---|---|---|---|---|
| 5 | 220 | 50.2 | — | — | — | — | 447 | 78 |
| 6 | — | — | 50.2 | 60.8 | — | — | — | — |
| 7 | — | — | 42.4 | 49.1 | 61.4 | 51.3 | — | — |
| 8 | — | — | 49.1 | 37.9 | 71.4 | 74.8 | — | — |
| 9 | — | — | 87.9 | 79.2 | 121.7 | 111.6 | — | — |

In order to verify that no substantial silicone residue was present on the adhesive tape (AFT 5344) that was removed from the Loparex PE and GL-1 release liners during the peel tests, subsequent adhesion tests were conducted to measure the adhesion of the adhesive tape to a stainless steel substrate.

The subsequent adhesion tests were conducted by laminating the AFT 5344 tape that was removed from the release liners to a stainless steel plate. The AFT 5344 tape and the steel plate were pressed together by making four passes with a 2.04 kg (4.5 lb) roller. The backing from the AFT 5344 was removed and replaced with a 0.127 mm (0.005 inch) thick aluminum backing material. The ATF 5344 with aluminum backing was pulled from the stainless steel substrate at a 90 degree angle using the Instron 5565, and the peel strength was determined. The results are shown in TABLE 3.

TABLE 3

| Example | Initial Subsequent Adhesion (g/cm) Treated Area | Initial Subsequent Adhesion (g/cm) Control Area | 1 day @ RT (g/cm) Treated Area | 1 day @ RT (g/cm) Control Area | 1 day @ 70° C. (g/cm) Treated Area | 1 day @ 70° C. (g/cm) Control Area | 3 days @ 70° C. (g/cm) Treated Area | 3 days @ 70° C. (g/cm) Control Area |
|---|---|---|---|---|---|---|---|---|
| 5 | 1183 | 1161 | — | — | — | — | 1161 | 1570 |
| 6 | — | — | 1864 | 1524 | — | — | — | — |
| 7 | — | — | 1641 | 1763 | 1596 | 1763 | — | — |
| 8 | — | — | 1819 | 1788 | 1574 | 1540 | — | — |
| 9 | — | — | 1378 | 1689 | 1083 | 1083 | — | — |

Examples 10 and 11

A 355 nm laser (commercially available as Coherent Avia, from Coherent, Inc. Santa Clara, Calif.) was used to mark a coextruded three-layer polyolefin film where the layers in order were approximately 25 microns of Dow 640i low density polyethylene (LDPE, available from Dow Chemical Company, Midland, Mich.), 50 microns of Dow 640i LDPE with 8% by weight Standridge 11937 white concentrate (available from Standridge Color Corporation, Social Circle, Ga.), and 25 microns of Dow DMDH 6400 high density polyethylene (HDPE). The pulse width of the laser was about 40 ns and the focused laser spot size was about 100 microns. The laser pulse repetition rate was 180 kHz, a scanning speed of 11.6 m/s was used.

Marks were made through the LDPE side and the HDPE side using average laser power settings of 11.5 watts, for examples 10 and 11, respectively. The line pattern produced by the laser marking was similar to Examples 1-4, except that the line spacing was 1.0 mm for both the LDPE and HDPE sides.

Peel tests for Examples 10 and 11 were performed by adhering the marked sample to an aluminum panel with 360 Black Doublecoat tape (available from 3M Company, St. Paul, Minn.). An Instron 5565 was used to conduct the tests. Four separate 2.54 cm (1 inch) wide strips of AFT 5344 tape were applied to the laser-marked side of the sample. The ATF 5344 tapes and the marked sample were pressed together by making four passes with a 2.04 kg (4.5 lb) roller. Each strip of ATF 5344 tape was pulled away from the release liner at a 90 degree angle and the force required to remove each AFT 5344 tape from the liner was determined in pounds force per inch, the force for each of the four strips was averaged, and then scaled to grams per cm. In all cases, the adhesive separated from the liner at the release surface with no detectable adhesive remaining on the release liner. Peel test data for examples 10 and 11 are shown in TABLE 4.

TABLE 4

| Example | Release testing after 1 week @ 70° C. (g/cm) Treated Area | Release testing after 1 week @ 70° C. (g/cm) Control Area |
|---|---|---|
| 10 | 306 | 304 |
| 11 | 474 | 447 |

In order to verify that no changes to the AFT 5344 tape were made during the peel testing, subsequent adhesion tests were conducted by laminating the AFT 5344 tape that was removed from the marked samples to a clear coat steel panel (RK8148 panel, available from ACT Test Panels, LLC, Hillsdale, Mich.). The AFT 5344 tape was removed by pulling from the steel panel at a 90 degree angle using the Instron 5565. The peel strength was determined in the same manner above where the reading from the four samples were averaged and reported in units of grams per centimeter. The subsequent adhesion testing results are shown in TABLE 5.

TABLE 5

| | Subsequent adhesion for samples testing after 1 week @ 70° C. (g/cm) | |
|---|---|---|
| Example | Treated Area | Control Area |
| 10 | 1743 | 1759 |
| 11 | 1428 | 1389 |

Examples 12 and 13

A 355 nm laser (commercially available as Coherent Avia, from Coherent, Inc. Santa Clara, Calif.) was used to mark ControlTac™ Removable Graphic Film 3545C and to mark Scotchcal™ ElectroCut™ Graphic Film 7725-14 (both films available from 3M Company, St. Paul, Minn.). The pulse width of the laser was about 40 ns and the focused laser spot size was about 100 microns. The laser pulse repetition rate was 180 kHz, a scanning speed of 11.6 m/s was used.

Marks were made using average laser power setting of 11.5 Watts for Examples 12 and 13. In these cases, the laser was incident on the liner side, passed through the release surface and into the layers below. When the liner was removed from adhesive layers of these samples, there were no marks in the liner material. The laser-made marks were visible through the clear adhesive in the film layer below.

Example 14

A 532 nm laser (commercially available as Innoslab from Edgewave in Wurselen, Germany) was used to make the similar material used in Example 10 and 11. The three layers in the film for Example 14 were approximately 25 microns of Dow 640i LDPE, 50 microns of Dow 640i LDPE with 2% by weight Standridge 11937 white concentrate, and approximately 25 microns of Exact 5181 (ethylene-based polymer available from ExxonMobil, Houston, Tex.). The pulse width of the laser was about 8 ns and the focused laser spot size was about 60 microns. The laser pulse repetition rate was 4 kHz, a scanning speed of 0.2 m/s was used.

Marks were made using average laser power setting of 0.8 Watts for Example 14. In this case, the laser was incident on the LDPE side, and created a visible mark within the film while leaving the LDPE surface unchanged.

Various embodiments of the invention have been described in detail. Although changes or modifications, both foreseeable and unforeseeable, can be made to the described embodiments by one of ordinary skill in the art, such changes and modifications, however, are not to be construed as outside the scope and spirit of the invention.

What is claimed:

1. A process, comprising:

providing a release liner, the release liner comprising an opaque laser-markable layer comprising at least one organic polymer and at least one light-sensitive pigment, and at least one release agent, the at least one release agent being transparent to a laser radiation; and laser-marking the opaque laser-markable layer by directing the laser radiation into the release liner through the at least one release agent to induce an interaction between the light-sensitive pigment and the organic polymer to form a visually perceptible marking in the release liner, wherein the release agent is not functionally damaged by the laser radiation.

2. The process according to claim 1 wherein providing the release liner further comprises mixing the organic polymer and the laser-sensitive pigment to form a blend, and extruding the blend to provide the opaque laser-markable layer, the laser-markable layer comprising a first major surface and a second major surface; and simultaneously co-extruding the at least one release agent over the first major surface of the laser-markable layer.

3. The process according to claim 1 wherein providing the release liner further comprises first forming the opaque laser-markable layer, wherein the opaque laser-markable layer has a first major surface and a second major surface, and thereafter applying the at least one release agent to one or both of the first and second major surfaces.

4. The process according to claim 1 wherein providing the release liner further comprises forming the opaque laser-markable layer, wherein the laser-markable layer has a first major surface and a second major surface, and applying an adhesive layer to one or both of the first and second major surfaces so that the adhesive layer is between the at least one release agent and the laser-markable layer.

5. The process according to claim 1 wherein the visually perceptible marking is an indicia of source.

6. An article, comprising:

an opaque laser-markable release liner comprising at least one organic polymer and at least one light-sensitive pigment; the opaque laser-markable release liner comprising a first major surface;

a first release agent disposed on the first major surface of the opaque laser-markable release liner; the at least one release agent being transparent to laser radiation, and a marking in the opaque laser-markable release liner visible through the first release agent, the marking resulting from a laser-induced interaction between the at least one light-sensitive pigment and the organic polymer.

7. The article according to claim 6 wherein the at least one polymer is selected from the group consisting of polyethylene terephthalate, polyolefin, thermoplastic elastomeric olefin and combinations thereof; and the light-sensitive pigment comprises titanium dioxide.

8. The article according to claim 6 wherein the opaque laser-markable release liner comprises a material selected from the group consisting of nonwoven materials, woven materials, cellulosic materials, films and combinations of two or more of the foregoing.

9. The article according to claim 6 wherein the light sensitive pigment is present at a concentration of less than about 10% by weight based on the weight of the opaque laser-markable release liner.

10. The article according to claim 6 wherein the opaque laser-markable release liner comprises (i) a first extruded layer comprising a polymer that is essentially transparent to laser radiation, wherein the first major surface is disposed on the first extruded layer; (ii) an opaque laser-markable layer; and (iii) a third extruded layer, the third extruded layer comprising a second major surface of the laser-markable release liner, wherein the opaque laser-markable layer is disposed between the first and third extruded layers.

11. The article according to claim 10 wherein the first extruded layer comprises low density polyethylene; the opaque laser-markable layer comprises high density polyethylene; the third extruded layer comprises medium density polyethylene; and the at least one light-sensitive pigment comprises titanium dioxide.

12. The article according to claim 11 wherein a second release agent is disposed on the second major surface.

13. The article according to claim 12 further comprising a pressure sensitive adhesive disposed on the second release agent.

14. A roll comprising the article according to claim 13, wherein the pressure sensitive adhesive is releasably adhered to both the first release agent and the second release agent, the first and second release agents selected so as to provide differential release properties with respect to the pressure sensitive adhesive.

15. The article according to claim 6 wherein the at least one release agent comprises a material selected from the group consisting of polyolefin, silicones, fluorosilicons, perfluoroethers, fluorocarbons, polymers with long alkyl side chains, and combinations of two or more of the foregoing.

16. A laser-markable release liner comprising (i) a first layer comprising a polymer that is essentially transparent to laser radiation, the first layer forming a first major surface of the laser-markable release liner; (ii) an opaque laser-markable layer; and (iii) a third layer providing a second major surface of the laser-markable release liner, wherein the opaque laser-markable layer is disposed between the first and third layers.

17. The article according to claim 16 wherein the first layer comprises a polyolefin release agent and the article further comprises an adhesive disposed between the first layer and the opaque laser-markable layer.

18. The article according to claim 17 wherein the polyolefin release agent is polyethylene.

19. The article according to claim 16 wherein the first layer comprises a first polyolefin release agent and the third layer comprises a second polyolefin release agent.

* * * * *

UNITED STATES PATENT AND TRADEMARK OFFICE

CERTIFICATE OF CORRECTION

PATENT NO. : 8,771,919 B2
APPLICATION NO. : 13/390407
DATED : July 8, 2014
INVENTOR(S) : Pingfan Wu et al.

It is certified that error appears in the above-identified patent and that said Letters Patent is hereby corrected as shown below:

In the Specification

Column 1
Line 2, Delete “Lui” and insert -- Liu --, therefor.

Column 8
Line 53, Delete “MULT-FLEX” and insert -- MULTI-FLEX --, therefor.

Column 10
Line 51, Delete “fluorosilicons” and insert -- fluorosilicones --, therefor.

In the Claims

Column 19
Line 13, In Claim 15, delete “fluorosilicons,” and insert -- fluorosilicones, --, therefor.

Signed and Sealed this
Twenty-fourth Day of February, 2015

Michelle K. Lee

Michelle K. Lee
*Deputy Director of the United States Patent and Trademark Office*